(12) United States Patent
Tajima et al.

(10) Patent No.: US 11,227,826 B2
(45) Date of Patent: Jan. 18, 2022

(54) SEMICONDUCTOR DEVICE HAVING CHIP STACKED AND MOLDED

(71) Applicants: KABUSHIKI KAISHA TOSHIBA, Minato-ku (JP); TOSHIBA MEMORY CORPORATION, Minato-ku (JP)

(72) Inventors: Takayuki Tajima, Sagamihara (JP); Kazuo Shimokawa, Yokohama (JP)

(73) Assignees: KABUSHIKI KAISHA TOSHIBA, Minato-ku (JP); TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/354,501

(22) Filed: Mar. 15, 2019

(65) Prior Publication Data

US 2020/0098678 A1 Mar. 26, 2020

(30) Foreign Application Priority Data

Sep. 25, 2018 (JP) .............................. JP2018-179285

(51) Int. Cl.
*H01L 23/498* (2006.01)
*H01L 23/00* (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC . H01L 21/4853; H01L 21/486; H01L 21/568; H01L 21/6835; H01L 2221/68345; H01L 2221/68359; H01L 2221/68381; H01L 2224/0401; H01L 2224/13111; H01L 2224/13139; H01L 2224/13147; H01L 2224/16146; H01L 2224/16238; H01L 2224/16503; H01L 2224/17181; H01L 2224/81005; H01L 2225/06513; H01L 2225/06517; H01L 2225/06541; H01L 2225/06565; H01L 2225/06572; H01L 2225/06582; H01L 23/3121; H01L 23/3128; H01L 23/49811; H01L 23/49816;
(Continued)

(56) References Cited

U.S. PATENT DOCUMENTS 9,048,233 B2 * 6/2015 Wu ..................... H01L 25/50
9,460,951 B2 10/2016 Lin
(Continued)

FOREIGN PATENT DOCUMENTS

JP 2-238696 9/1990
JP 2003-124212 4/2003
(Continued)

*Primary Examiner* — Duy T Nguyen
(74) *Attorney, Agent, or Firm* — Oblon, McClelland, Maier & Neustadt, L.L.P.

(57) ABSTRACT

A semiconductor device includes an insulating layer, a conductive member provided inside the insulating layer, a chip disposed on a first surface of the insulating layer and connected to the conductive member, and an electrode connected to the conductive member via a barrier layer. A resistivity of the barrier layer is higher than a resistivity of the conductive member. At least a portion of the electrode protrudes from a second surface of the insulating layer.

5 Claims, 14 Drawing Sheets

(51) Int. Cl.
*H01L 25/065* (2006.01)
*H01L 23/31* (2006.01)
*H01L 21/683* (2006.01)
*H01L 21/48* (2006.01)
*H01L 25/18* (2006.01)

(52) U.S. Cl.
CPC .... *H01L 21/6835* (2013.01); *H01L 23/49811* (2013.01); *H01L 23/49827* (2013.01); *H01L 23/49866* (2013.01); *H01L 24/16* (2013.01); *H01L 24/81* (2013.01); *H01L 25/0657* (2013.01); *H01L 23/3121* (2013.01); *H01L 24/13* (2013.01); *H01L 24/17* (2013.01); *H01L 25/18* (2013.01); *H01L 2221/68345* (2013.01); *H01L 2221/68359* (2013.01); *H01L 2224/13111* (2013.01); *H01L 2224/13139* (2013.01); *H01L 2224/13147* (2013.01); *H01L 2224/16146* (2013.01); *H01L 2224/16238* (2013.01); *H01L 2224/16503* (2013.01); *H01L 2224/17181* (2013.01); *H01L 2224/81005* (2013.01); *H01L 2225/06513* (2013.01); *H01L 2225/06517* (2013.01); *H01L 2225/06541* (2013.01); *H01L 2225/06565* (2013.01); *H01L 2225/06582* (2013.01); *H01L 2924/014* (2013.01); *H01L 2924/01028* (2013.01); *H01L 2924/01327* (2013.01); *H01L 2924/1438* (2013.01); *H01L 2924/14511* (2013.01)

(58) Field of Classification Search
CPC ......... H01L 23/49827; H01L 23/49838; H01L 23/49866; H01L 24/13; H01L 24/16; H01L 24/17; H01L 24/81; H01L 25/0657; H01L 25/18; H01L 25/50; H01L 2924/01028; H01L 2924/01327; H01L 2924/014; H01L 2924/1438; H01L 2924/14511; H01L 2924/15311
USPC .......................................................... 257/737
See application file for complete search history.

(56) References Cited

U.S. PATENT DOCUMENTS

| | | |
|---|---|---|
| 2007/0126085 A1 | 6/2007 | Kawano et al. |
| 2009/0175023 A1* | 7/2009 | Sakamoto ............. H01L 21/486 361/820 |
| 2010/0308443 A1* | 12/2010 | Suthiwongsunthorn ..................... H01L 21/561 257/621 |
| 2011/0278716 A1* | 11/2011 | Hsu .......... H01L 24/11 257/737 |
| 2013/0048358 A1 | 2/2013 | Kanki. et al. |
| 2014/0264875 A1 | 9/2014 | Kanki |
| 2015/0364461 A1 | 12/2015 | Kato et al. |
| 2015/0364462 A1 | 12/2015 | Nakaiso et al. |
| 2015/0371941 A1 | 12/2015 | Nakaiso et al. |
| 2015/0371984 A1 | 12/2015 | Kato et al. |
| 2017/0317069 A1 | 11/2017 | Kato et al. |
| 2019/0287895 A1 | 9/2019 | Tajima et al. |

FOREIGN PATENT DOCUMENTS

| | | |
|---|---|---|
| JP | 2007-180529 | 7/2007 |
| JP | 2012-114256 | 6/2012 |
| JP | 2014-86525 A | 5/2014 |
| JP | 2016-058745 | 4/2016 |
| JP | 2019-161003 A | 9/2019 |
| KR | 10-2010-0114845 A | 10/2010 |
| TW | I484614 B | 5/2015 |
| TW | I543263 B | 7/2016 |

\* cited by examiner

SEMICONDUCTOR DEVICE HAVING CHIP STACKED AND MOLDED

CROSS-REFERENCE TO RELATED APPLICATIONS

This application is based upon and claims the benefit of priority from Japanese Patent Application No. 2018-179285, filed on Sep. 25, 2018; the entire contents of which are incorporated herein by reference.

FIELD

Embodiments relate to a semiconductor device and a method for manufacturing the same.

BACKGROUND

Conventionally, a semiconductor device is manufactured in which memory chips are multiply stacked on a printed circuit board and molded using a resin. Bumps are bonded to the lower surface of the printed circuit board; and the semiconductor device is mounted via the bumps to an electronic device, etc. On the other hand, due to requirements for thinner semiconductor devices of recent years, technology has been proposed in which a redistribution layer is used instead of the printed circuit board. The memory chips are mounted on the upper surface of the redistribution layer; and the bumps are bonded to the lower surface of the redistribution layer.

DETAILED DESCRIPTION

A semiconductor device according to an embodiment includes an insulating layer, a conductive member provided inside the insulating layer, a chip disposed on a first surface of the insulating layer and connected to the conductive member, and an electrode connected to the conductive member via a barrier layer. A resistivity of the barrier layer is higher than a resistivity of the conductive member. At least a portion of the electrode protrudes from a second surface of the insulating layer.

A method for manufacturing a semiconductor device according to an embodiment, includes forming a release layer, a first barrier layer, a conductive layer, and a second barrier layer on a support substrate. The method includes forming a first insulating layer on the second barrier layer. A first opening is formed in the first insulating layer. The method includes forming a second opening in the second barrier layer by etching using the first insulating layer as a mask. The second opening communicates with the first opening. The method includes forming an electrode inside the second opening and inside a lower portion of the first opening. The method includes forming a third barrier layer on an inner surface of an upper portion of the first opening. The method includes forming a first via inside an upper portion of the first opening and forming an interconnect on the first insulating layer. A resistivity of the interconnect is lower than a resistivity of the third barrier layer. The method includes forming a second insulating layer on the interconnect. A third opening is formed in the second insulating layer. The method includes forming a second via inside the third opening. The second via is connected to the interconnect. The method includes connecting a chip to the second via. The method includes removing the support substrate by removing the release layer. The method includes removing the first barrier layer, the conductive layer, and the second barrier layer.

An embodiment will now be described.

Figure 1:
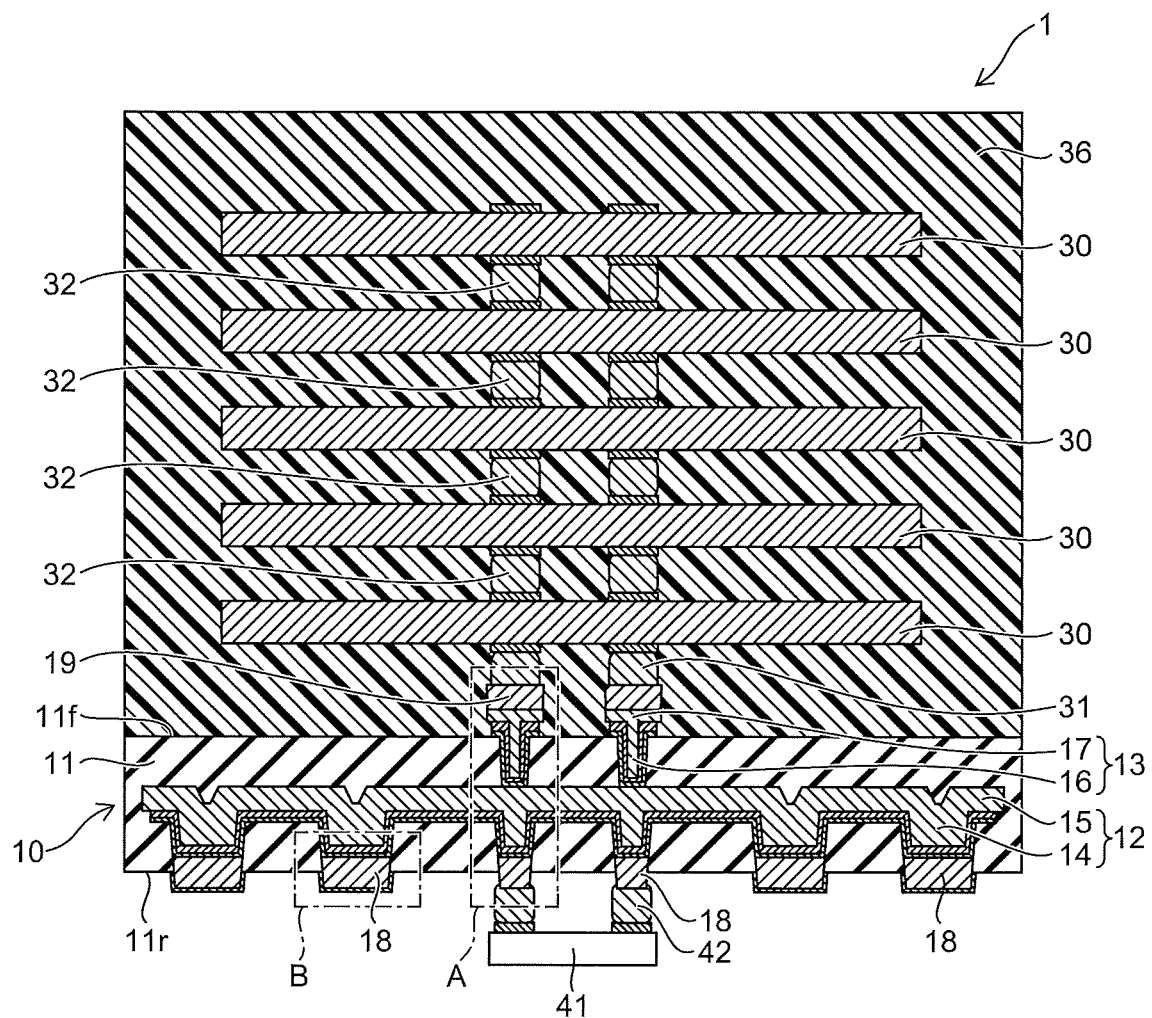
FIG. 1 is a cross-sectional view showing a semiconductor device according to an embodiment.

FIG. 1 is a cross-sectional view showing a semiconductor device according to the embodiment.

Figure 2:
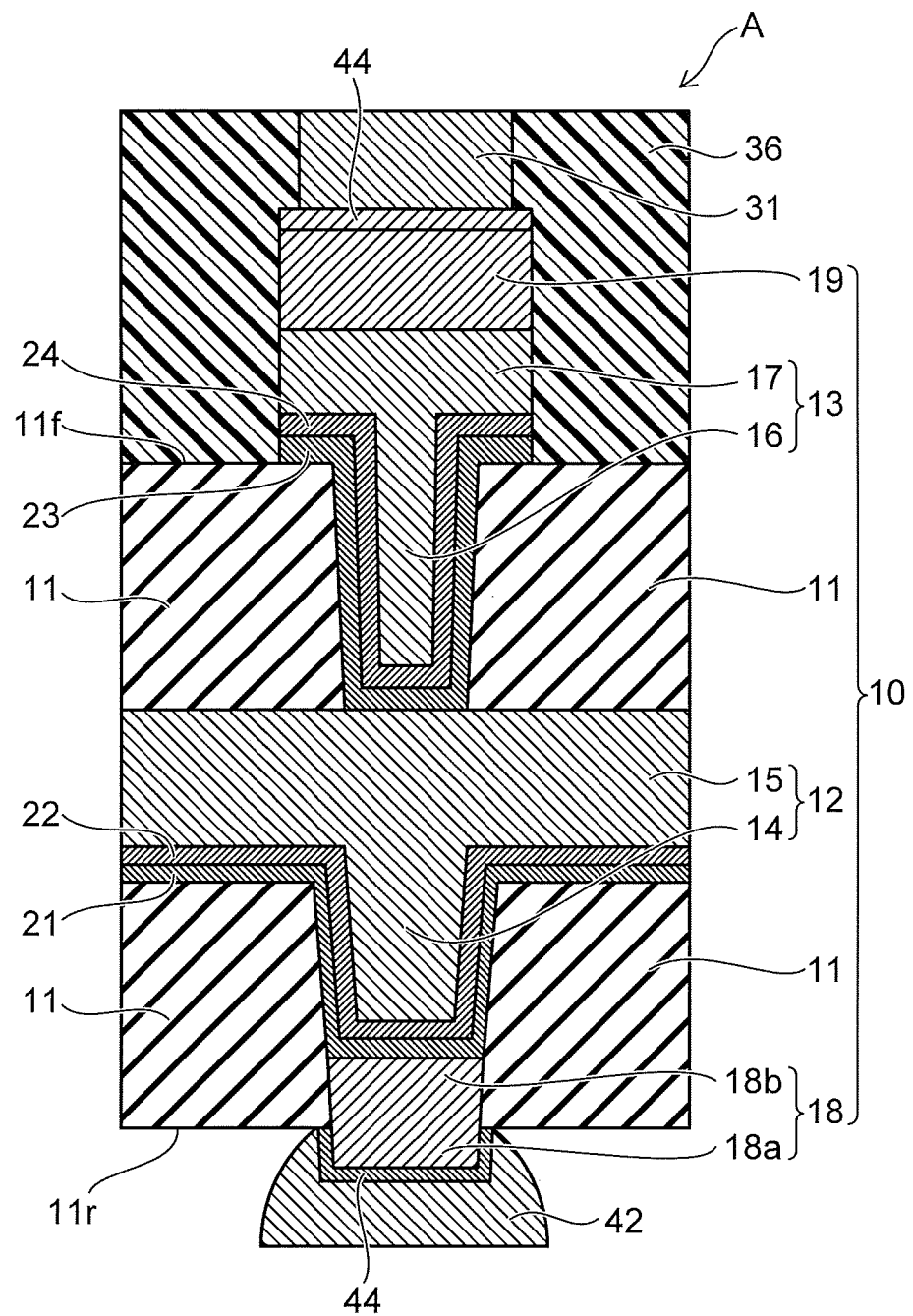
FIG. 2 is a partially enlarged cross-sectional view showing region A of FIG. 1.

FIG. 2 is a partially enlarged cross-sectional view showing region A of FIG. 1.

Figure 3:
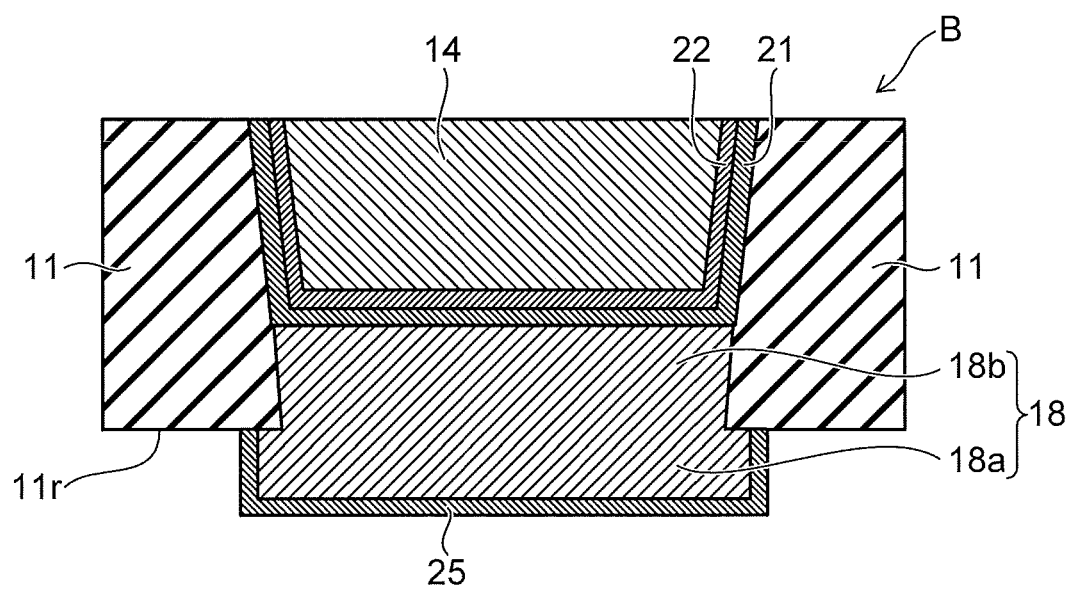
FIG. 3 is a partially enlarged cross-sectional view showing region B of FIG. 1.

FIG. 3 is a partially enlarged cross-sectional view showing region B of FIG. 1.

As shown in FIG. 1 and FIG. 2, a redistribution layer 10 is provided in the semiconductor device 1 according to the embodiment. In the redistribution layer 10, for example, an insulating layer 11 that is made of an organic material as a main material is provided; and a lower conductive member 12 and an upper conductive member 13 are provided substantially inside the insulating layer 11. For example, the lower conductive member 12 and the upper conductive member 13 are formed of a metal material such as copper (Cu), etc. The lower conductive member 12 is disposed in the lower level of the redistribution layer 10; and the upper conductive member 13 is disposed in the upper level of the redistribution layer 10.

The lower portion of the lower conductive member 12 is a via 14; and the upper portion of the lower conductive member 12 is an interconnect 15. The via 14 and the interconnect 15 are formed as one body. The via 14 extends in the vertical direction; and the interconnect 15 extends in the horizontal direction. The via 14 and the interconnect 15 are disposed inside the insulating layer 11.

The lower portion of the upper conductive member 13 is a via 16; and the upper portion of the upper conductive member 13 is a pad 17. The via 16 and the pad 17 are formed as one body. The via 16 extends in the vertical direction; and the pad 17 spreads along the horizontal plane. The via 16 is disposed inside the insulating layer 11. The pad 17 is disposed on an upper surface 11f of the insulating layer 11. Generally, when viewed from above, the position of the via 16 is different from the position of the via 14; but overlapping portions may exist.

Multiple electrodes 18 and multiple electrodes 19 are further provided in the redistribution layer 10. The electrodes 18 and 19 include, for example, nickel (Ni) and are made of, for example, pure nickel. The electrode 18 is provided on the lower surface of the via 14. The electrode 19 is disposed on the upper surface of the pad 17. When viewed from the vertical direction, the configurations of the electrodes 18 and 19 may be circles, quadrilaterals, or polygons other than quadrilaterals.

Also, in the semiconductor device 1, multiple semiconductor chips 30 are provided on the upper surface 11f of the insulating layer 11 and are stacked along the vertical direction. The semiconductor chips 30 are, for example, three-dimensional NAND memory chips.

The electrode 19 of the redistribution layer 10 and the semiconductor chip 30 of the lowermost level are bonded by a micro-bump 31. An intermetallic compound layer 44 that includes a solder component and nickel is formed between the electrode 19 and the micro-bump 31. The mutually-adjacent semiconductor chips 30 are bonded to each other by micro-bumps 32. In the specification, "bonded" refers to the state of being mechanically linked and electrically connected. Through-vias (not illustrated) are provided inside the semiconductor chips 30; and the micro-bump 31 or 32 below each semiconductor chip 30 transmits the signals input from the redistribution layer 10 to the memory cells of the semiconductor chip 30 and to the semiconductor chips 30 of the higher levels.

A resin member 36 is provided on the redistribution layer 10. The resin member 36 is made from a resin material and covers the stacked semiconductor chips 30 and the micro-bumps 31 and 32.

A control chip 41 is mounted on the lower surface of the redistribution layer 10. The control chip 41 is bonded to the electrode 18 of the redistribution layer 10 via a micro-bump 42. In other words, a portion of the multiple electrodes 18 is bonded to the control chip 41 via the micro-bump 42. For example, the micro-bump 42 is made of solder. The intermetallic compound layer 44 that includes a solder component and nickel is formed between the electrode 18 and the micro-bump 42. A resin member that covers the micro-bump 42 may be provided between the redistribution layer 10 and the control chip 41.

As shown in FIG. 1 to FIG. 3, a titanium (Ti) layer 21 is provided to be continuous on the lower surface of the via 14, on the side surface of the via 14, and on the lower surface of the interconnect 15. Accordingly, the titanium layer 21 is interposed between the via 14 and the insulating layer 11. The titanium layer 21 is interposed also between the insulating layer 11 and the lower surface of the interconnect 15. A copper layer 22 is provided between the lower conductive member 12 and the titanium layer 21. The via 14 is connected to the electrode 18 via the copper layer 22 and the titanium layer 21.

A titanium layer 23 is provided on the lower surface of the via 16, on the side surface of the via 16, and on the lower surface of the pad 17. A copper layer 24 is provided between the upper conductive member 13 and the titanium layer 23.

The via 16 is connected to the interconnect 15 via the copper layer 24 and the titanium layer 23. Thereby, the via 16 is connected to the via 14 via the interconnect 15.

As shown in FIG. 3, an upper portion 18b of the electrode 18 is disposed inside the insulating layer 11; and a lower portion 18a of the electrode 18 protrudes from a lower surface 11r of the insulating layer 11. The protrusion amount of the lower portion 18a from the lower surface 11r is, for example, about 100 nm (nanometers). Gold layers 25 are provided on the exposed surfaces of the lower portions 18a of the electrodes 18 to which the micro-bumps 42 are not bonded. The thickness of the gold layer 25 is, for example, about 50 nm.

In the semiconductor device 1, the semiconductor chips 30 are connected externally by through-vias (not illustrated), the micro-bumps 32 and 31, the electrode 19, the pad 17, the via 16, the copper layer 24, the titanium layer 23, the interconnect 15, the via 14, the copper layer 22, the titanium layer 21, and the electrode 18. For example, the control chip 41 functions as an interface controlling the transmission of the signals between the multiple semiconductor chips 30 and the outside, and functions as a controller controlling the operations of these semiconductor chips 30.

The case where a bump is bonded to the semiconductor device 1 will now be described.

Figure 4:
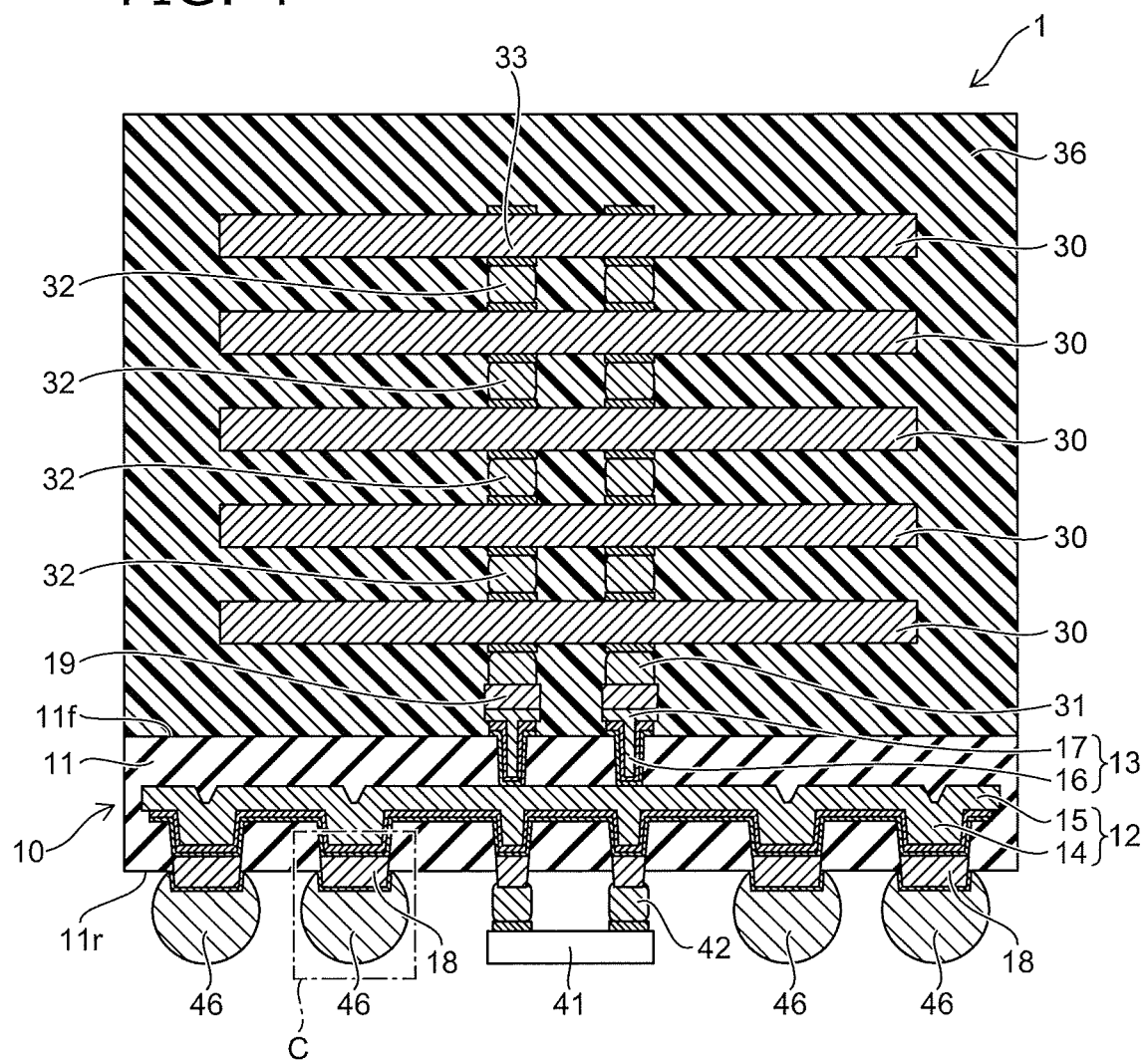
FIG. 4 is a cross-sectional view showing the semiconductor device according to the embodiment to which a bump is bonded.

FIG. 4 is a cross-sectional view showing the semiconductor device according to the embodiment to which a bump is bonded.

Figure 5:
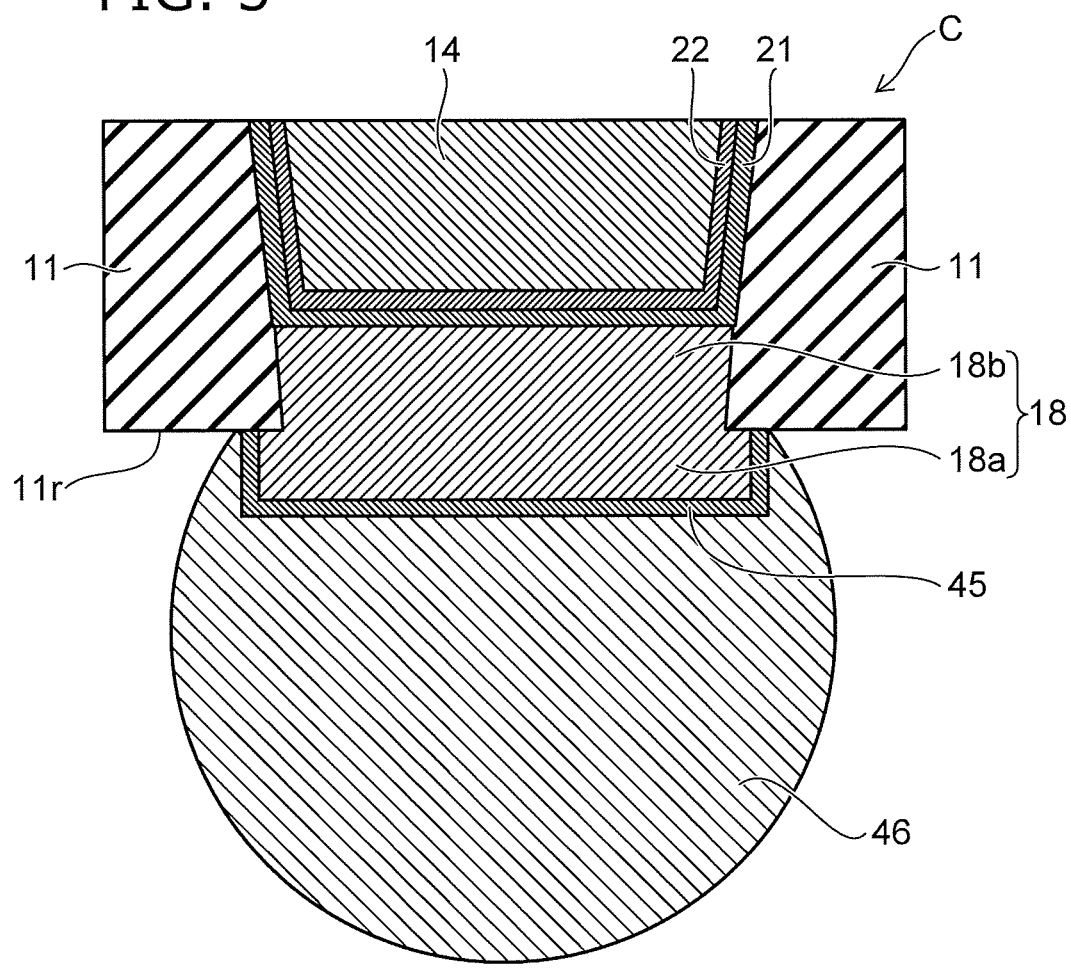
FIG. 5 is a partially enlarged cross-sectional view showing region C of FIG. 4.

FIG. 5 is a partially enlarged cross-sectional view showing region C of FIG. 4.

As shown in FIG. 4 and FIG. 5, bumps 46 are bonded to the electrodes 18 to which the micro-bumps 42 are not bonded. The bump 46 is made of solder. The solder includes, for example, tin (Sn), silver (Ag), and copper. The melting points of the bump 46 and the micro-bump 42 are lower than the melting points of the micro-bumps 31 and 32. Therefore, remelting of the micro-bumps 31 and 32 can be avoided when bonding the micro-bump 42 and the bump 46.

The diameter of the bump 46 is larger than the diameters of the micro-bumps 31, 32, and 42 and is, for example, 300 μm (microns). The bump 46 contacts the lower surface and the side surface of the lower portion 18a of the electrode 18 and covers at least a portion, e.g., substantially the entirety, of the lower surface and the side surface. The gold layer 25 diffuses into the bump 46 and is consumed by the bump 46 due to the heat when bonding the bump 46 to the electrode 18. An intermetallic compound layer 45 that has a solder material and nickel as major components is formed between the electrode 18 and the bump 46. The intermetallic compound layers 44 and 45 include, for example, nickel, tin, and copper and include, for example, $Ni_3Sn_4$, $Cu_6Sn_5$, $Cu_3Sn$, etc. The thicknesses of the intermetallic compound layers 44 and 45 are dependent on the time and the temperature of the bonding, but are substantially about 1 μm. The intermetallic compound layers 44 and 45 can be detected by cross section observation using a SEM (Scanning Electron Microscope), or by cross section observation and composition analysis using EDX (energy dispersive X-ray spectroscopy).

A method for manufacturing the semiconductor device according to the embodiment will now be described.

FIGS. 6A to 6D, FIGS. 7A to 7D, FIGS. 8A to 8D, FIG. 9, FIG. 10, FIG. 11, FIGS. 12A and 12B, and FIGS. 13A and 13B are cross-sectional views showing the method for manufacturing the semiconductor device according to the embodiment.

Figure 12A:
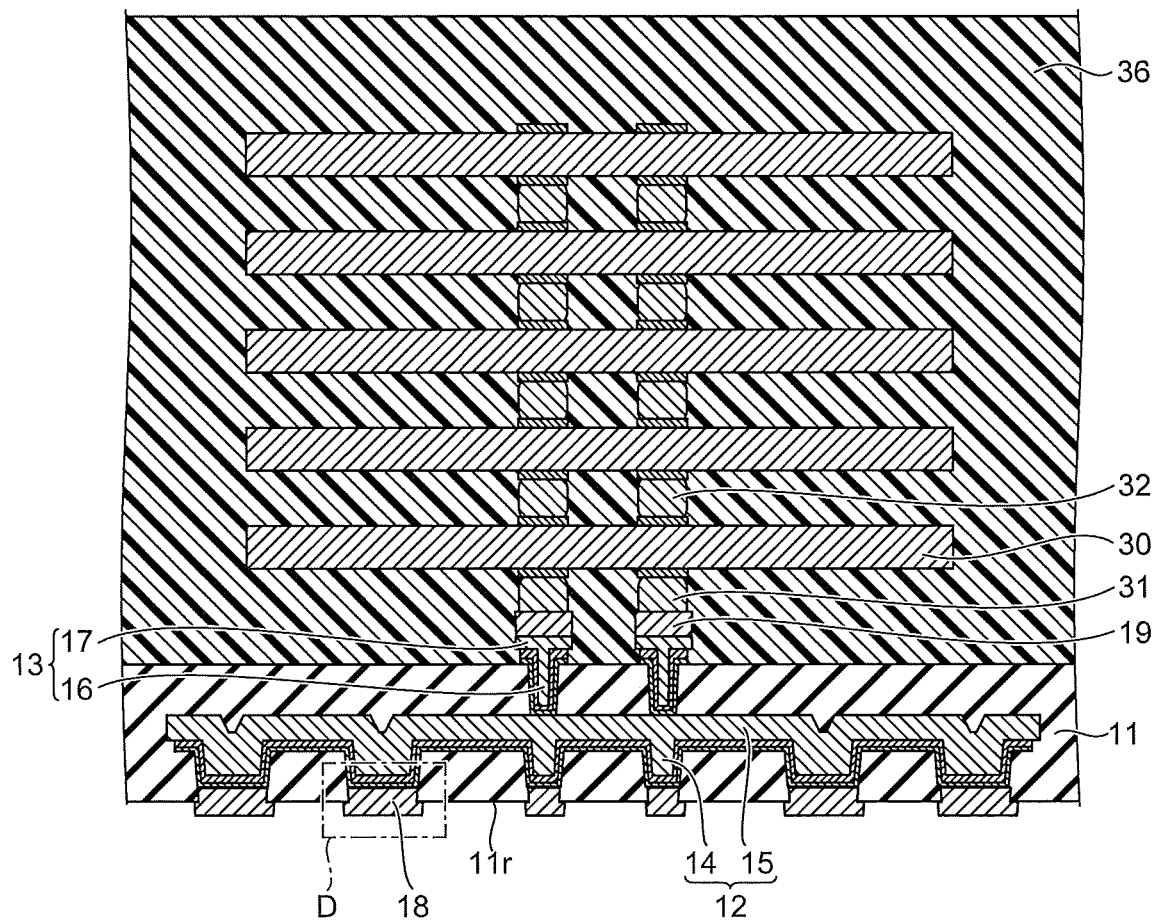
FIG. 12A is a cross-sectional view showing the method for manufacturing the semiconductor device according to the embodiment.
Figure 12B:
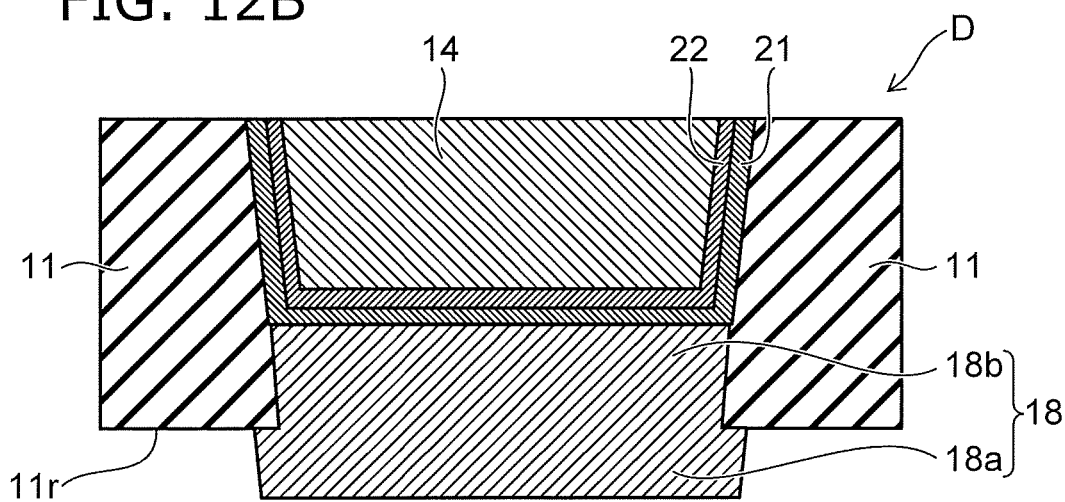
FIG. 12B is a partially enlarged cross-sectional view showing region D of FIG. 12A.

FIG. 12B is a partially enlarged cross-sectional view showing region D of FIG. 12A.

Figure 13A:
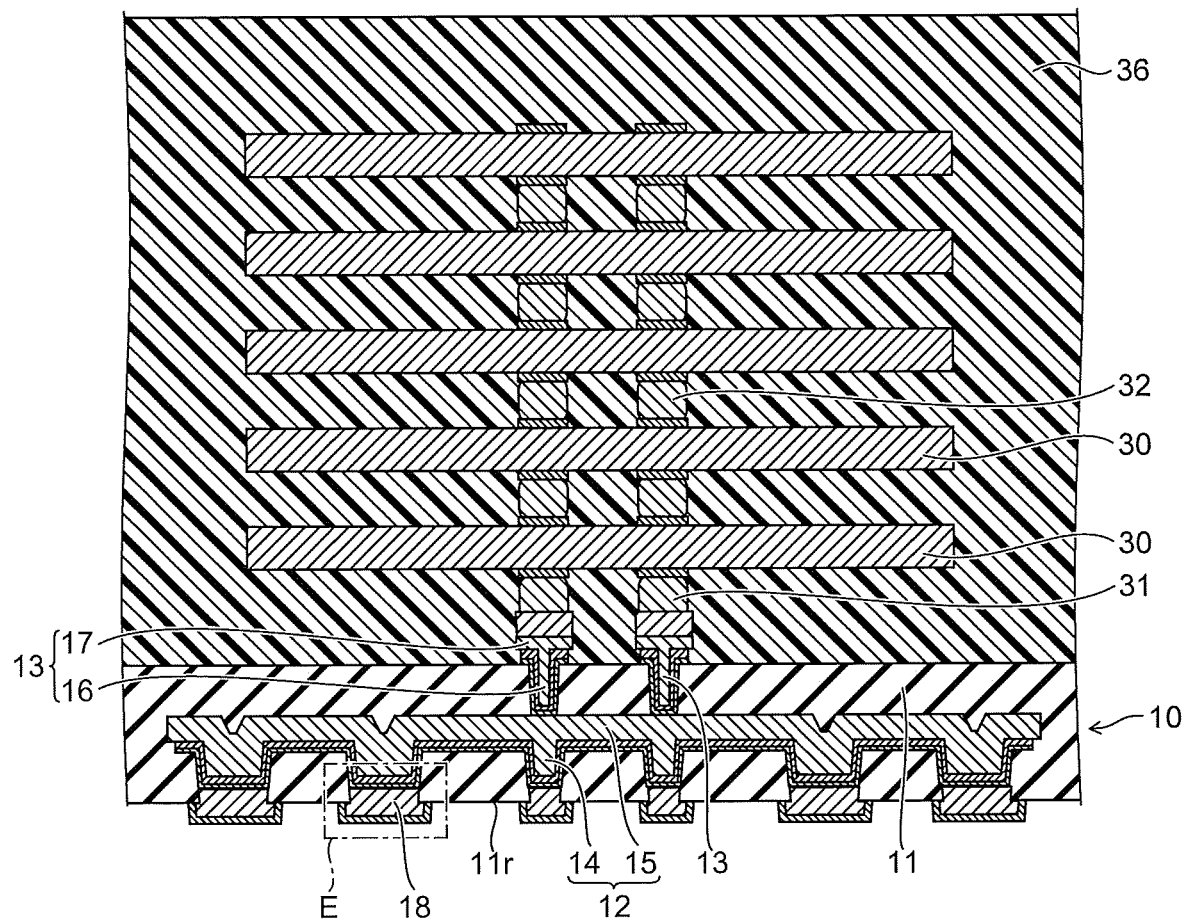
FIG. 13A is a cross-sectional view showing the method for manufacturing the semiconductor device according to the embodiment.
Figure 13B:
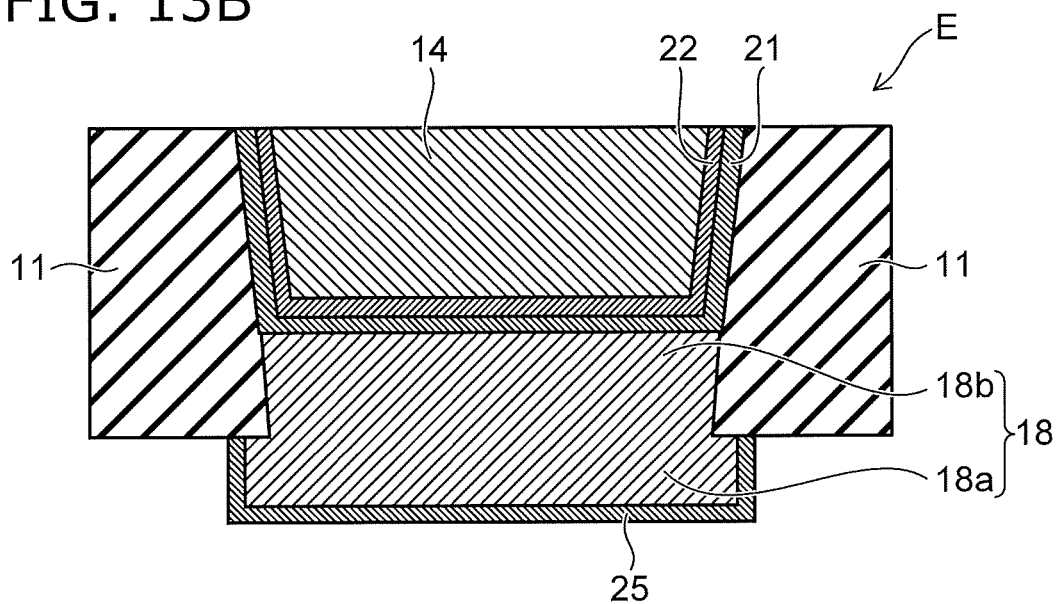
FIG. 13B is a partially enlarged cross-sectional view showing region E of FIG. 13A.

FIG. 13B is a partially enlarged cross-sectional view showing region E of FIG. 13A.

Figure 6A:
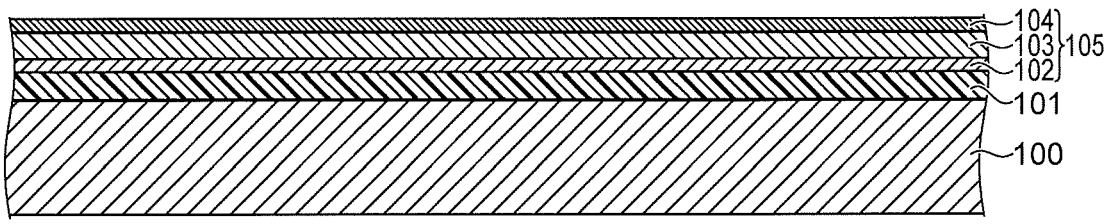
FIGS. 6A to 11 are cross-sectional views showing a method for manufacturing the semiconductor device according to the embodiment.

First, a support substrate 100 is prepared as shown in FIG. 6A. The support substrate 100 is, for example, a silicon wafer or a glass substrate. Then, a release layer 101 is formed on the upper surface of the support substrate 100. The release layer 101 is, for example, an organic material dissolvable in a designated chemical liquid, an organic material in which light irradiation produces a decomposition reaction, or an organic material or an inorganic material in which a constant or higher stress application causes peeling.

Then, a titanium layer 102 (a first barrier layer) is formed to be continuous on the release layer 101; a copper layer 103 (a conductive layer) is formed to be continuous on the titanium layer 102; and a titanium layer 104 (a second barrier layer) is formed to be continuous on the copper layer 103. The titanium layer 102 has good adhesion to the release layer 101. A seed layer 105 includes the titanium layer 102, the copper layer 103, and the titanium layer 104.

Figure 6B:
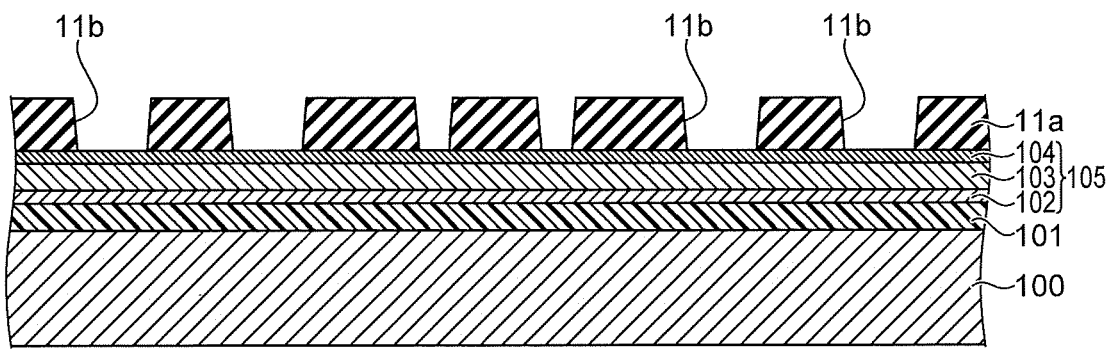

Then, as shown in FIG. 6B, an insulating layer 11a (a first insulating layer) that is made of, for example, an organic material is formed on the seed layer 105. Then, a via hole 11b (a first opening) is formed in the insulating layer 11a by, for example, lithography or laser irradiation. The seed layer 105 is exposed at the bottom surface of the via hole 11b.

Figure 6C:
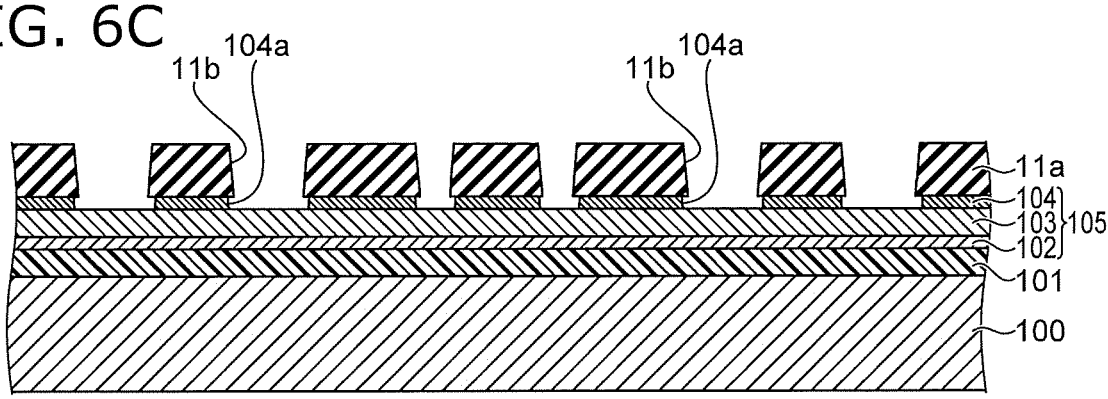

Continuing as shown in FIG. 6C, the portion of the titanium layer 104 not covered with the insulating layer 11a is removed by, for example, etching. As a result, an opening 104a (a second opening) is formed in the titanium layer 104; and the copper layer 103 is exposed. The portion of the titanium layer 104 covered with the insulating layer 11a remains.

Figure 6D:
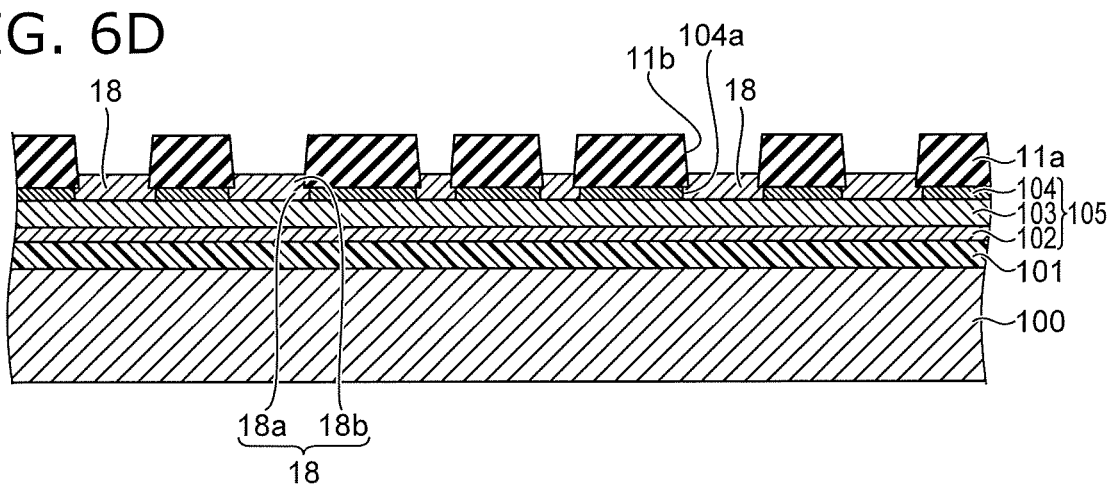

Then, as shown in FIG. 6D, nickel is deposited by performing electroplating via the seed layer 105. Thereby, the electrode 18 is formed inside the opening 104a of the titanium layer 104 and inside the lower portion of the via hole 11b. The uniformity of the plating thickness can be high because the conductivity of the copper layer 103 is high. The portion of the electrode 18 disposed inside the opening 104a becomes the lower portion 18a; and the portion of the electrode 18 disposed inside the lower portion of the via hole 11b becomes the upper portion 18b.

Figure 7A:
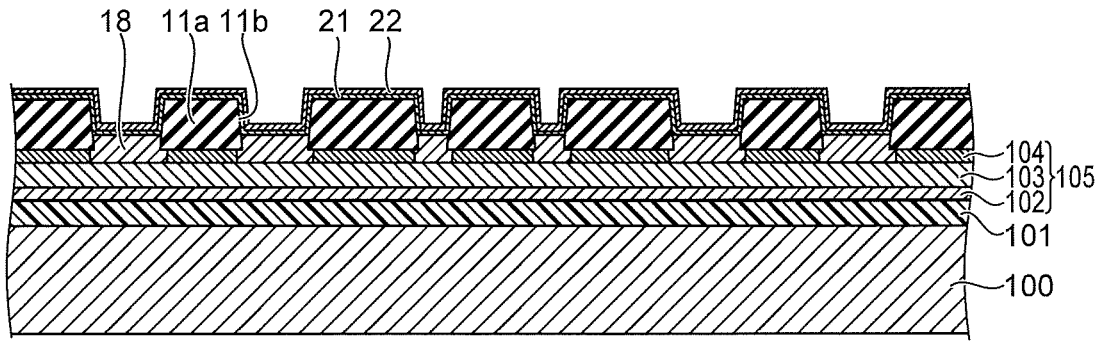

Continuing as shown in FIG. 7A, the titanium layer 21 (a third barrier layer) is formed by, for example, depositing titanium on the entire surface by sputtering. Then, for example, the copper layer 22 is formed by depositing copper on the entire surface by sputtering. The titanium layer 21 and the copper layer 22 are formed to be continuous on the side surface of the upper portion of the via hole 11b, on the upper surface of the insulating layer 11a, and on the upper surface of the electrode 18.

Figure 7B:
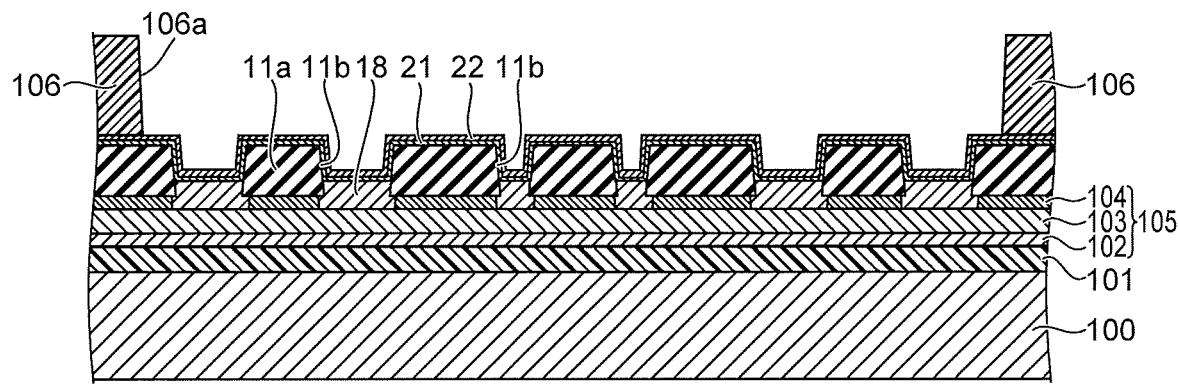

Then, as shown in FIG. 7B, a resist pattern 106 is formed on the copper layer 22. An opening 106a is formed in the resist pattern 106 by lithography. The via hole 11b is positioned at the bottom surface of the opening 106a. Thereby, the opening 106a communicates with the via hole 11b.

Figure 7C:
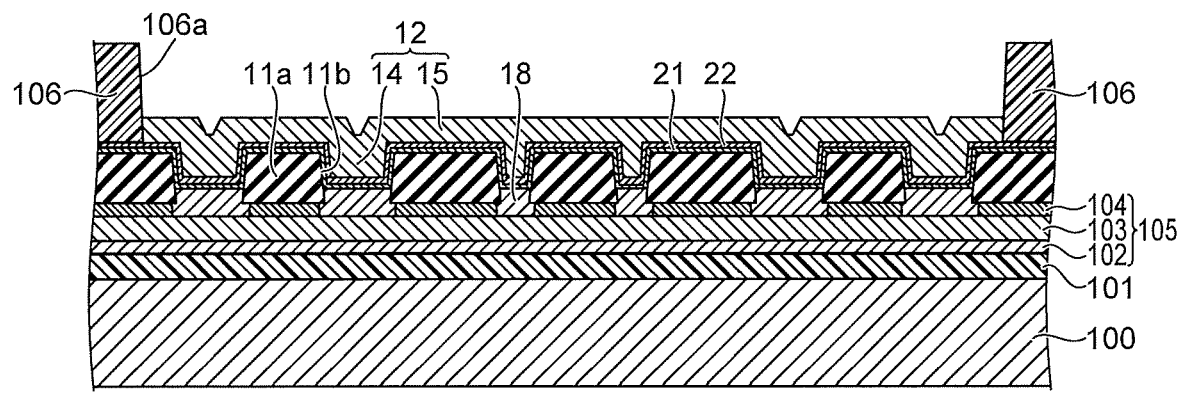

Continuing as shown in FIG. 7C, the lower conductive member 12 is formed inside the opening 106a by electroplating copper via the copper layer 22. The lower conductive member 12 is formed as one body with the copper layer 22. The portion of the lower conductive member 12 filled into the upper portion of the via hole 11b becomes the via 14; and the portion of the lower conductive member 12 deposited on the insulating layer 11a becomes the interconnect 15. The via 14 is connected to the electrode 18 via the copper layer 22 and the titanium layer 21.

Figure 7D:
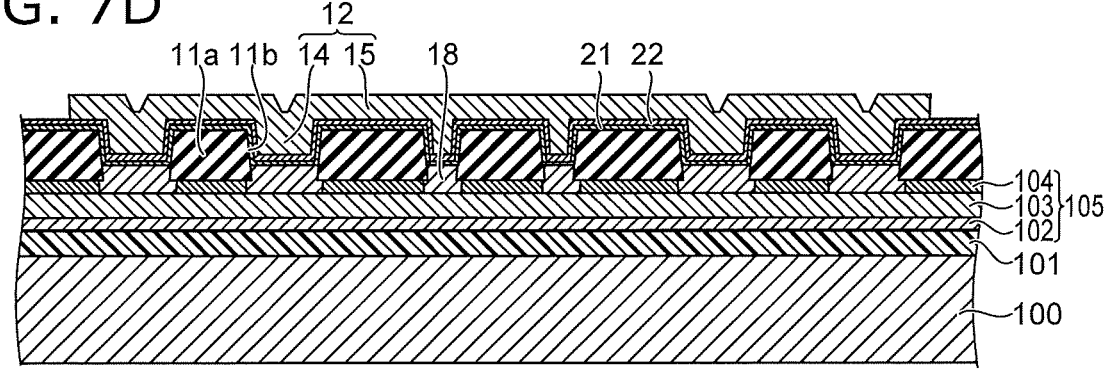

Then, the resist pattern 106 is removed as shown in FIG. 7D. The portion of the copper layer 22 that was covered with the resist pattern 106 is exposed thereby.

Figure 8A:
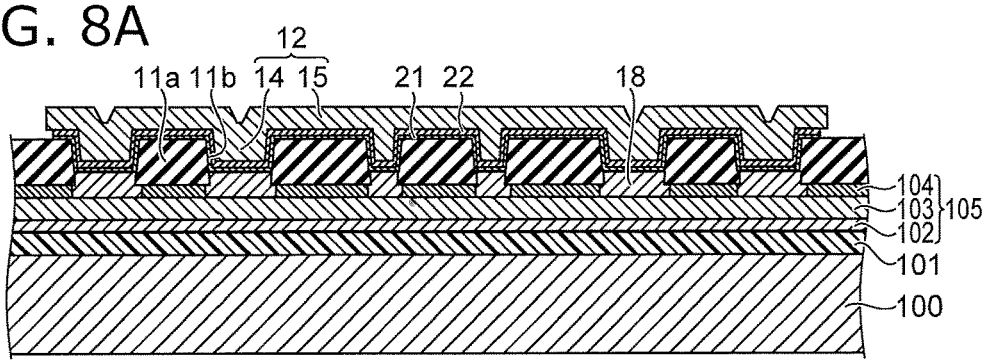

Continuing as shown in FIG. 8A, the portions of the copper layer 22 and the titanium layer 21 not covered with the lower conductive member 12 are removed by, for example, etching. As a result, the insulating layer 11a is exposed again. On the other hand, the portions of the copper layer 22 and the titanium layer 21 covered with the lower conductive member 12 remain.

Figure 8B:
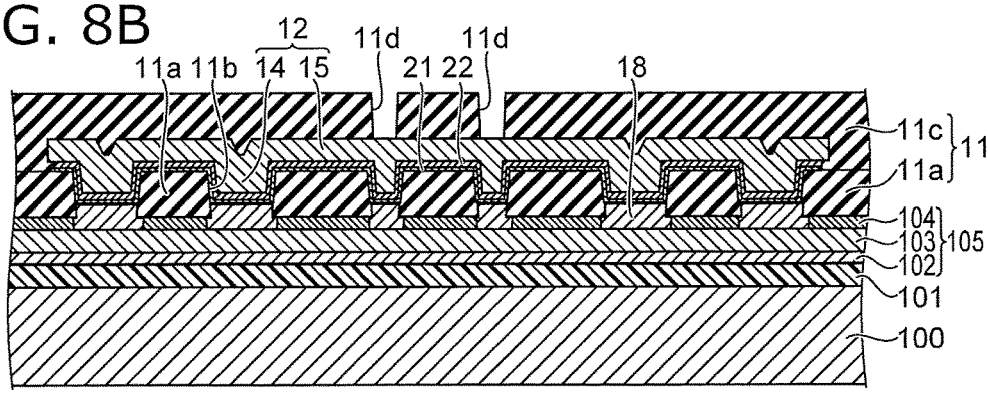

Then, as shown in FIG. 8B, an insulating layer 11c (a second insulating layer) that is made of, for example, an organic material is formed on the insulating layer 11a and the lower conductive member 12. The insulating layer 11 is formed of the insulating layer 11a and the insulating layer 11c. Then, a via hole 11d (a third opening) is formed in the insulating layer 11c by, for example, lithography or laser irradiation. The interconnect 15 of the lower conductive member 12 is exposed at the bottom surface of the via hole 11d. Hereinafter, the insulating layer 11a and the insulating layer 11c are shown as the insulating layer 11 without differentiating.

Figure 8C:
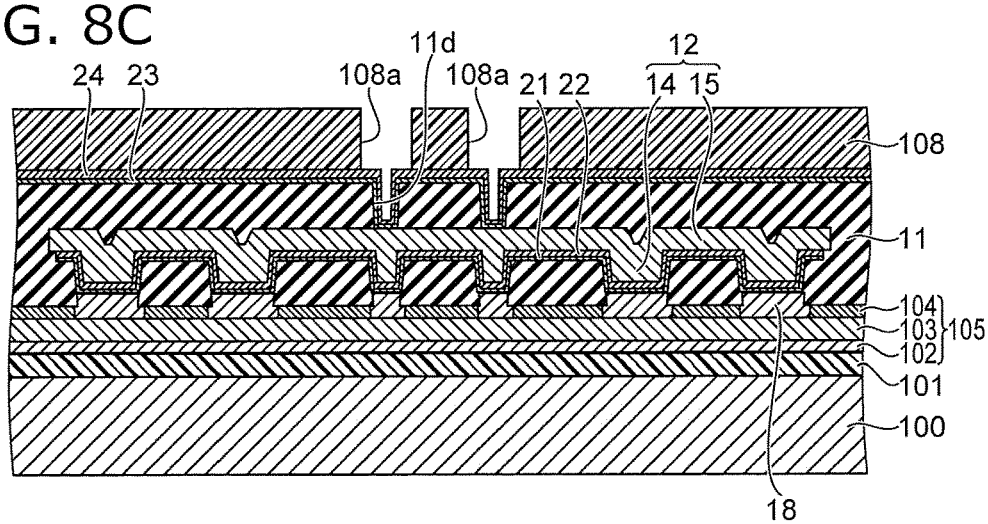

Continuing as shown in FIG. 8C, the titanium layer 23 is formed by, for example, depositing titanium on the entire surface by sputtering. Then, the copper layer 24 is formed by, for example, depositing copper on the entire surface by sputtering. The titanium layer 23 and the copper layer 24 are formed to be continuous on the upper surface of the insulating layer 11 and on the inner surface of the via hole 11d.

Then, a resist pattern 108 is formed on the copper layer 24. An opening 108a is formed in the resist pattern 108 by lithography. The via hole 11d is positioned at the bottom surface of the opening 108a. Thereby, the opening 108a communicates with the via hole 11d.

Figure 8D:
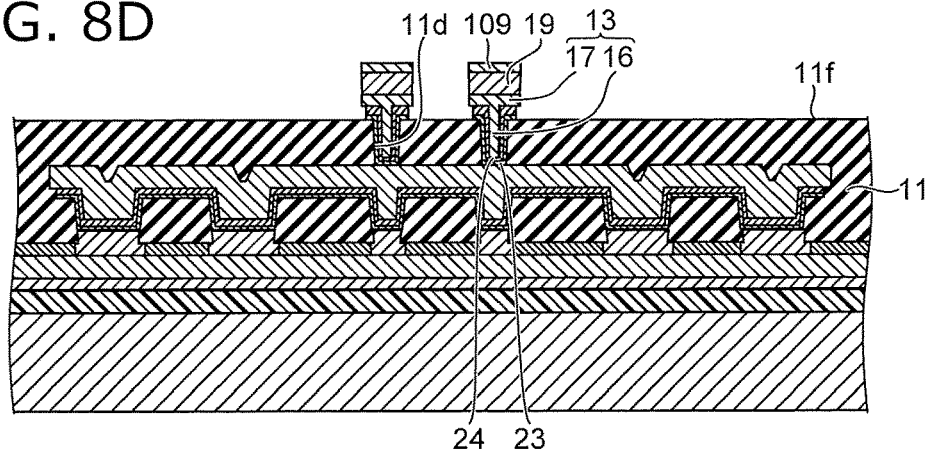

Continuing as shown in FIG. 8D, the upper conductive member 13 is formed inside the opening 108a by electroplating copper via the copper layer 24. The upper conductive member 13 is formed as one body with the copper layer 24. The portion of the upper conductive member 13 filled into the via hole 11d becomes the via 16; and the portion of the upper conductive member 13 deposited on the insulating layer 11 becomes the pad 17. The via 16 is connected to the interconnect 15 via the copper layer 24 and the titanium layer 23. Then, the electrode 19 that is made of nickel is formed on the pad 17 of the upper conductive member 13 by electroplating nickel via the upper conductive member 13. Then, displacement plating of a noble metal, e.g., gold is performed on the electrode 19. Thereby, a portion of the nickel is eluted from the electrode 19; and the gold precipitates. As a result, a gold layer 109 is formed on the upper surface of the electrode 19.

Then, the resist pattern 108 (referring to FIG. 8C) is removed. The portion of the copper layer 24 that was covered with the resist pattern 108 is exposed thereby. Also, the pad 17, the electrode 19, and the gold layer 109 protrude from the copper layer 24.

Continuing, the portions of the copper layer 24 and the titanium layer 23 not covered with the upper conductive member 13 are removed by, for example, etching. As a result, the insulating layer 11 is exposed again. The portions of the copper layer 24 and the titanium layer 23 covered with the upper conductive member 13 remain.

Figure 9:
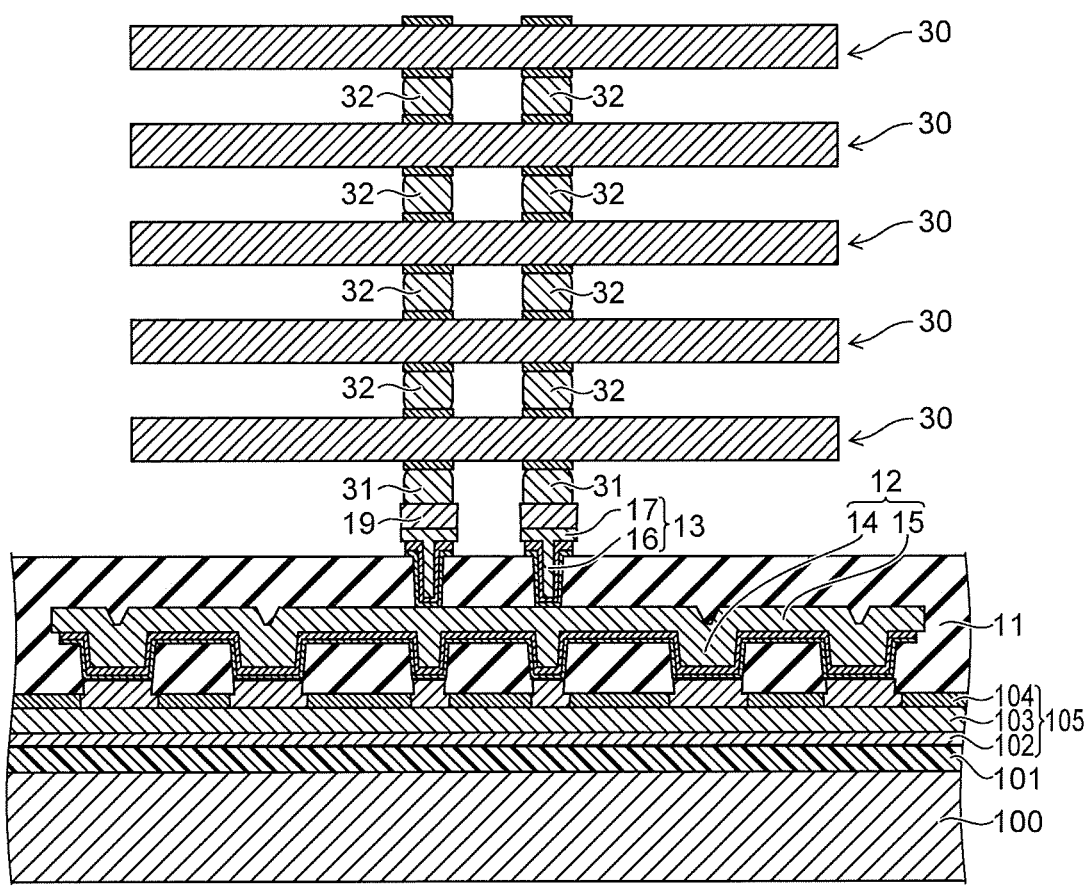

Then, as shown in FIG. 9, the semiconductor chip 30 is bonded to the upper surface of the electrode 19 via the micro-bump 31. At this time, the gold layer 109 diffuses into the micro-bump 31 and is consumed by the micro-bump 31; and the intermetallic compound layer 44 that has copper, tin, and nickel as major components is newly formed (referring to FIG. 2). Then, the multiple semiconductor chips 30 are stacked on the semiconductor chip 30 via the micro-bumps 32. Thereby, the multiple semiconductor chips 30 are stacked on the insulating layer 11. The multiple semiconductor chips 30 are connected to the pad 17 via the micro-bumps 32 and 31 and the electrode 19. A stacked body that is made of the multiple semiconductor chips 30 pre-bonded to each other via the micro-bumps 32 may be bonded to the electrode 19 via the micro-bump 31.

Figure 10:
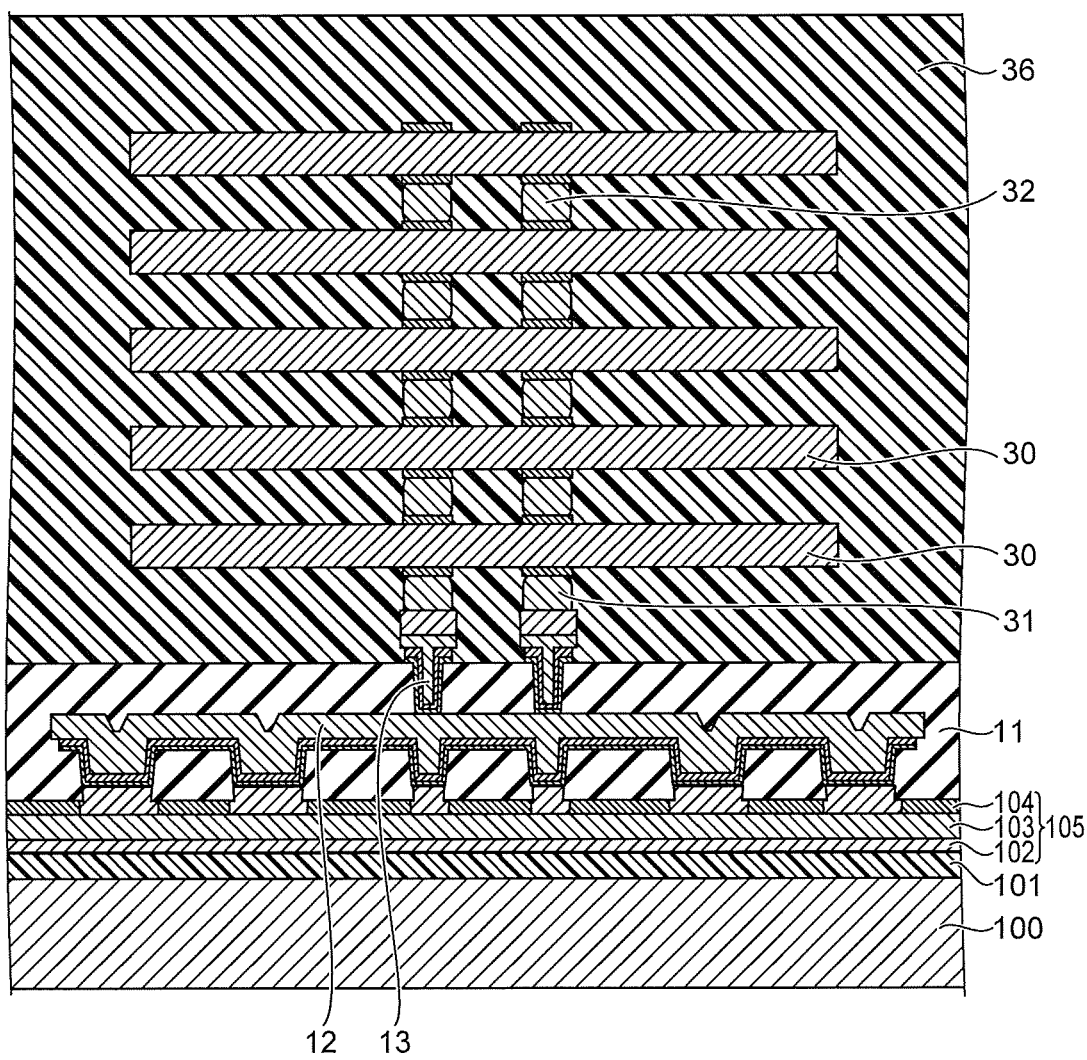

Continuing as shown in FIG. 10, the resin member 36 is formed by molding a resin material to cover and seal the stacked body made of the multiple semiconductor chips 30 on the insulating layer 11 and by, for example, thermally curing at a temperature of 200° C. or less.

Figure 11:
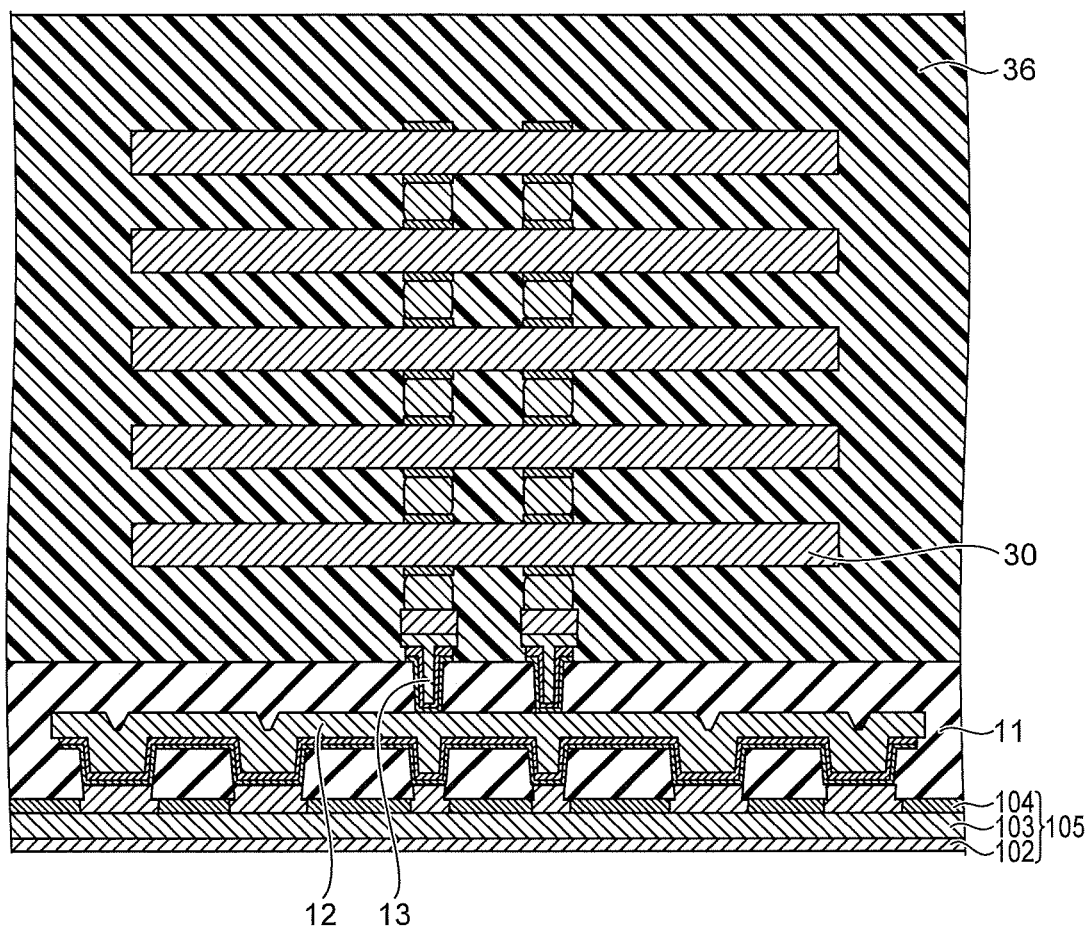

Then, as shown in FIG. 11, the release layer 101 (referring to FIG. 10) is removed by, for example, dissolving using a chemical liquid or by decomposing by light irradiation. Or, the support substrate 100 (referring to FIG. 10) is peeled from the release layer 101 by a force exceeding the adhesion force of the release layer 101. Thereby, the support substrate 100 is removed; and the seed layer 105 is exposed.

Continuing as shown in FIGS. 12A and 12B, the seed layer 105 (referring to FIGS. 11A and 11B), i.e., the titanium layer 102, the copper layer 103, and the titanium layer 104, is removed. The insulating layer 11 and the lower portion 18a of the electrode 18 are exposed thereby. At this time, the lower portion 18a of the electrode 18 protrudes from the lower surface 11r of the insulating layer 11 by the amount of the thickness of the titanium layer 104.

Then, as shown in FIGS. 13A and 13B, displacement plating of a noble metal, e.g., gold is performed. Thereby, a portion of the nickel is eluted from the lower portion 18a of the electrode 18; and the gold precipitates. As a result, the gold layer 25 is formed on the side surface of the lower portion 18a of the electrode 18 and on the lower surface of the lower portion 18a. The redistribution layer 10 is formed by the processes recited above.

Continuing as shown in FIG. 1 and FIG. 2, the control chip 41 is bonded via the micro-bumps 42 to a portion of the electrodes 18. The gold layer 25 diffuses into the micro-bump 42 and is consumed by the micro-bump 42 due to the heating when bonding. Also, the intermetallic compound layer 44 that has copper, tin, and nickel as major components is formed between the micro-bump 42 and the lower portion 18a of the electrode 18. A resin member may be formed to cover the micro-bump 42 between the redistribution layer 10 and the control chip 41.

Then, the redistribution layer 10 and the resin member 36 are cut by dicing. The multiple semiconductor devices 1 are manufactured thereby. The configuration of the semiconductor device 1 is as shown in FIG. 1 to FIG. 3.

Effects of the embodiment will now be described.

In the embodiment, the structure body that is made of the redistribution layer 10, the semiconductor chips 30, the resin member 36, etc., is formed on the support substrate 100 in the processes shown in FIG. 6A to FIG. 10; subsequently, the support substrate 100 is removed in the process shown in FIG. 11. Thereby, the semiconductor chips 30 can be connected to the bumps 46 via the redistribution layer 10. As a result, the semiconductor device 1 can be thinner compared to the case where a printed circuit board is used.

In the embodiment, the titanium layer 104 is formed in the process shown in FIG. 6A; the opening 104a is formed in the titanium layer 104 in the process shown in FIG. 6C; the lower portion 18a of the electrode 18 is formed inside the opening 104a in the process shown in FIG. 6D; and the titanium layer 104 is removed in the process shown in FIG. 12A. Thereby, in the semiconductor device 1 after completion as shown in FIG. 1 and FIG. 3, the lower portion 18a of the electrode 18 protrudes from the lower surface 11r of the insulating layer 11 by the amount of the thickness of the titanium layer 104.

As a result, as shown in FIG. 4 and FIG. 5, the bump 46 is bonded to cover the side surface of the electrode 18 when bonding the bump 46 to the electrode 18. Therefore, the electrode 18 acts as an anchor of the bump 46; and the bonding force between the bump 46 and the electrode 18 increases. In particular, the shear force, i.e., the resistance to a force in the horizontal direction, improves. Also, the entire exposed surface of the bump 46 is a convex surface; and a concave portion that is pinched-in, etc., is not formed in the bump 46. Therefore, cracks that have the concave portion as a starting point can be avoided in the bump 46. As a result, the reliability of the bump 46 increases.

In the embodiment, the titanium layer 104 is interposed between the copper layer 103 and the insulating layer 11 in the process shown in FIG. 6B to FIG. 11. The adhesion between the copper layer 103 and the insulating layer 11 is high because the insulating layer 11 is made from an organic material, and because titanium has good adhesion to organic materials. Therefore, the manufacturing stability of the semiconductor device 1 is high. On the other hand, because the adhesion between organic materials and copper is poor, peeling may occur at the interface if the insulating layer 11 and the copper layer 103 are in direct contact.

In the embodiment, the titanium layer 21 is provided between the insulating layer 11 and the lower conductive member 12; and the titanium layer 23 is provided between the insulating layer 11 and the upper conductive member 13. The peeling of the lower conductive member 12 and the upper conductive member 13 from the insulating layer 11 can be suppressed thereby.

Although the materials of the lower conductive member 12 and the upper conductive member 13 are not limited to copper, it is favorable to use a material having high conductivity to suppress the resistance between the bump 46 and the semiconductor chip 30. Also, although examples are shown in the embodiment in which the titanium layers 21 and 23 are provided as the barrier layers, this is not limited thereto; and layers made of other materials may be provided. However, it is favorable for the material of the barrier layer to have good adhesion to organic materials. Generally expressed, it is favorable for the resistivities of the materials of the lower conductive member 12 and the upper conductive member 13 to be lower than that of the material of the barrier layer; and it is favorable for the material of the barrier layer to have a higher adhesion to organic materials than do the materials of the lower conductive member 12 and the upper conductive member 13. Based on experience, there is a tendency for the adhesion to organic materials to increase as the melting point of the metal increases; therefore, for example, a metal material having a higher melting point than that of copper can be used as the material of the barrier layer.

After the control chip 41 is bonded and before the dicing, if necessary, solder balls that are used to form the bumps 46 may be supplied and bonded, by heating, to the electrodes 18 not bonded to the control chip 41. Due to the heating when bonding, the gold layer 25 diffuses into the bump 46 and is consumed by the bump 46. Also, the intermetallic compound layer 45 that has copper, tin, and nickel as major components is formed between the lower portion 18a of the electrode 18 and the bump 46. The semiconductor device 1 that has the bumps 46 attached can be manufactured thereby.

A comparative example will now be described.

Figure 14:
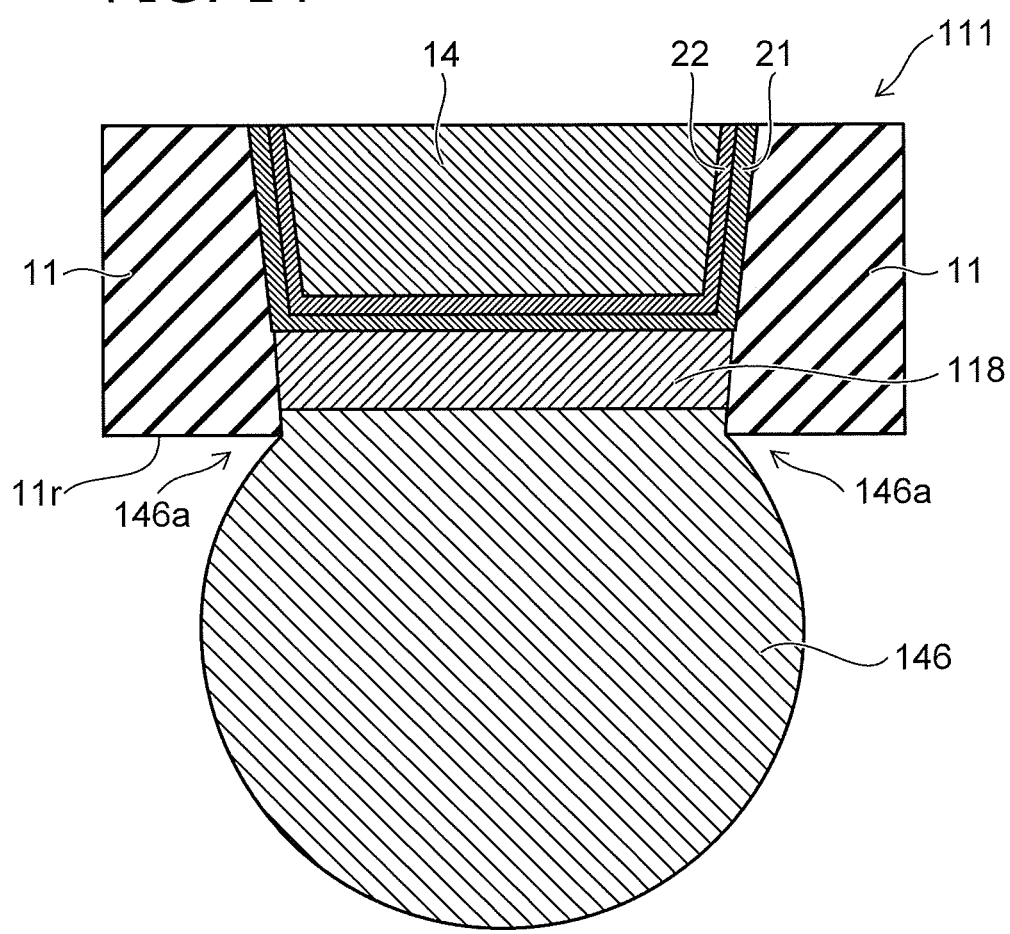
FIG. 14 is a cross-sectional view showing a semiconductor device according to a comparative example.

FIG. 14 is a cross-sectional view showing a semiconductor device according to the comparative example. FIG. 14 shows a portion corresponding to region B of FIG. 1.

In the semiconductor device 111 according to the comparative example as shown in FIG. 14, the lower surface of an electrode 118 is at a position recessed from the lower surface 11r of the insulating layer 11. Therefore, when a bump 146 is bonded to the electrode 118, a pinched-in portion 146a may be formed in the bump 146 at the extension plane of the lower surface 11r. As a result, for example, a crack may occur in the bump 146 with the pinched-in portion 146a as a starting point when a shear force in the horizontal direction is applied; and the bump 146 may undesirably fracture. Therefore, the reliability of the bump 146 in the semiconductor device 111 is low.

According to the embodiments described above, a semiconductor device and a method for manufacturing the semiconductor device can be realized in which the bonding strength of the bump can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   an insulating layer;
   a conductive member provided inside the insulating layer;
   a chip disposed on a first surface of the insulating layer and connected to the conductive member;
   a first barrier layer provided between the conductive member and the insulating layer; and
   an electrode connected to the conductive member via the first barrier layer and having an interface contacting to the first barrier layer, a resistivity of the first barrier layer being higher than a resistivity of the conductive member, a portion of the electrode protruding from a second surface of the insulating layer, the interface being disposed between the first surface and the second surface, wherein
   the conductive member includes:
      a first via connected to the chip;
      a second via connected to the electrode; and
      an interconnect connected between the first via and the second via,
   the second via and the interconnect are formed as one body;
   the first barrier layer is disposed at least on a lower surface of the second via, on a side surface of the second via, and on a lower surface of the interconnect, and the second via is connected to the electrode via the first barrier layer.

2. The device according to claim 1, further comprising a bump bonded to the electrode.

3. The device according to claim 2, wherein the bump covers a side surface of the electrode and a lower surface of the electrode.

4. The device according to claim 1, wherein the electrode includes nickel.

5. The device according to claim 1, further comprising a second barrier layer provided between the first via and the interconnect.

* * * * *